United States Patent
SeyedzadehDelcheh et al.

(10) Patent No.: US 10,950,292 B1
(45) Date of Patent: Mar. 16, 2021

(54) METHOD AND APPARATUS FOR MITIGATING ROW HAMMER ATTACKS

(71) Applicant: Advanced Micro Devices, Inc., Santa Clara, CA (US)

(72) Inventors: SeyedMohammad SeyedzadehDelcheh, Bellevue, WA (US); Steven Raasch, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/710,424

(22) Filed: Dec. 11, 2019

(51) Int. Cl.
*G11C 11/40* (2006.01)
*G11C 11/4078* (2006.01)
*G11C 11/406* (2006.01)
*G06F 12/1018* (2016.01)
*G11C 11/408* (2006.01)

(52) U.S. Cl.
CPC ...... *G11C 11/4078* (2013.01); *G06F 12/1018* (2013.01); *G11C 11/4085* (2013.01); *G11C 11/40607* (2013.01); *G11C 11/40615* (2013.01); *G11C 11/40618* (2013.01)

(58) Field of Classification Search
CPC ............ G11C 11/4078; G11C 11/4085; G11C 11/40618; G11C 11/40615; G11C 11/40607; G06F 12/1018
See application file for complete search history.

(56) References Cited

U.S. PATENT DOCUMENTS

2015/0149693 A1* 5/2015 Ng ..................... G11C 16/10
711/103

OTHER PUBLICATIONS

Kim, Dae-Hyun et al.; Architectural Support for Mitigating Row Hammering in DRAM Memories; IEEE Computer Architecture Letters; vol. 14, No. 1; Jun. 2015.
Seyedzadeh, Mohammad, et al; Mitigating Wordline Crosstalk Using Adaptive Trees of Counters; ISCA; 2018.
Jeong, Min Kyu et al.; Balancing DRAM Locality and Parallelism in Shared Memory CMP Systems; HPCA; 2012.
Kim, Yoongu; Flipping Bits in Memory Without Accessing Them: An Experimental Study of DRAM Disturbance Errors; SIGARCH; 2014.
Zhou, Sheng-hua et al.; An ultra-low power CMOS random number generator; Solid-State Electronics; 2008.

(Continued)

*Primary Examiner* — Jay W. Radke
(74) *Attorney, Agent, or Firm* — Faegre Drinker Biddle & Reath LLP

(57) ABSTRACT

An integrated circuit includes an aggressor wordline cache and logic that determines a candidate upper adjacent address and a candidate lower adjacent address of a target memory row corresponding to a read request to memory. When at least one of the candidate upper adjacent address or the candidate lower adjacent address are determined to be a victim row, the logic checks the aggressor wordline cache for a cache hit for the target memory row. When there is a cache hit in the aggressor wordline cache, the logic sends a corresponding cache line as a response to the read request, otherwise the logic causes a read of content from the memory. In certain examples, the logic includes a stored bit array and a hash function-based filter, which determines whether any of the candidate upper adjacent address and the candidate lower adjacent address are victim rows represented in the stored bit array.

22 Claims, 6 Drawing Sheets

(56) References Cited

OTHER PUBLICATIONS

Aweke, Zelalem Birhanu et al.; Anvil: Software-Based Protection Against Next-Generation Rowhammer Attacks; ASPLOS; 2016.
Herath, Nishad et al.; These are Not Your Grand Daddy's CPU Performance Counters: CPU Hardware Performance Counters for Security; Black Hat, 2015.
Liu, Jamie et al.; RAIDR: Retention-Aware Intelligent DRAM Refresh; SIGARCH; 2012.
Van De Goor, Ad. J. et al.; Address and Data Scrambling: Causes and Impact on Memory Tests; DELTA; 2002.
Bloom, Burton H.; Space/Time Trade-offs in Hash Coding with Allowable Errors; Communications of the ACM; 1970.
Fan, Bin et al.; Cuckoo Filter: Practically Better Than Bloom; CoNEXT; 2014.

* cited by examiner

METHOD AND APPARATUS FOR MITIGATING ROW HAMMER ATTACKS

GOVERNMENT LICENSE RIGHTS

This invention was made with Government support under PathForward Project with Lawrence Livermore National Security (Prime Contract No. DE-AC52-07NA27344, Subcontract No. B620717) awarded by the Department of Energy (DOE). The Government has certain rights in this invention.

BACKGROUND OF THE DISCLOSURE

Because of high memory intensive workloads and many-core systems, demand for high dynamic random access memory (DRAM) capacity is increasing more than ever. One way for increasing DRAM capacity is to scale down memory technology via reducing the proximity and size of cells and packing more cells in the same die area.

Recent studies show that because of high process variation and strong parasitic capacitances among cells of physically adjacent wordlines, wordline electromagnetic coupling (crosstalk) considerably increases in technology nodes below the 22 nm process node. Specifically, frequently activating and deactivating wordlines exacerbates the crosstalk among cells leading to disturbance errors in adjacent wordlines, thereby endangering reliability of future DRAM technology. Unfortunately, the wordline crosstalk opens a window for attackers to intentionally induce errors in the memory, such as main memory.

The current solutions for mitigating wordline crosstalk can be categorized to four main groups. The first group uses deterministic approaches to track frequently targeted wordlines, called aggressors, and then refresh their neighboring wordlines, called victim rows, as long as the number of wordline accesses reaches to the specific threshold, called the row hammering threshold. Note that the row hammering threshold is the minimum number of wordline accesses before the first error occurs. One solution for implementing the deterministic approach is to deploy counters uniformly across each DRAM bank and then each counter supervises a specific region of the DRAM bank. While this approach works efficiently for uniform memory access frequency, many counters would be underutilized for memory intensive workloads with high data-locality. To dynamically distribute counters within the memory bank, some systems track hot regions with high access frequency during consecutive refresh intervals and apply more counters to them in contrast to memory regions with less memory accesses.

The second group uses probabilistic approaches to refresh victim rows using a Random Number Generator (RNG) embedded in the memory controller. However, the accuracy of probabilistic approaches considerably depends on randomness of numbers generated by the RNG. Hence, they require true RNGs, which are known to be complex and to consume relatively large power.

The third group takes advantage of the fact that row hammer attacks depend on knowing the physical layout of adjacent wordlines so that the attack can predict the results of hammering and thereby exploit the bit-flipped results. In this regime, the proposed approach scrambles the physical wordline addresses making it difficult for attackers to know about the physical memory layout.

In contrast to hardware solutions, the fourth group takes advantage of software solutions to detect aggressor rows. Specifically, they use the last-level cache miss rate and row accesses with high temporal locality to mitigate wordline crosstalk. However, such systems sacrifice system performance and energy efficiency.

BRIEF DESCRIPTION OF THE DRAWINGS

The implementations will be more readily understood in view of the following description when accompanied by the below figures, wherein like reference numerals represent like elements, and wherein.

DETAILED DESCRIPTION OF IMPLEMENTATIONS

Figure 1:
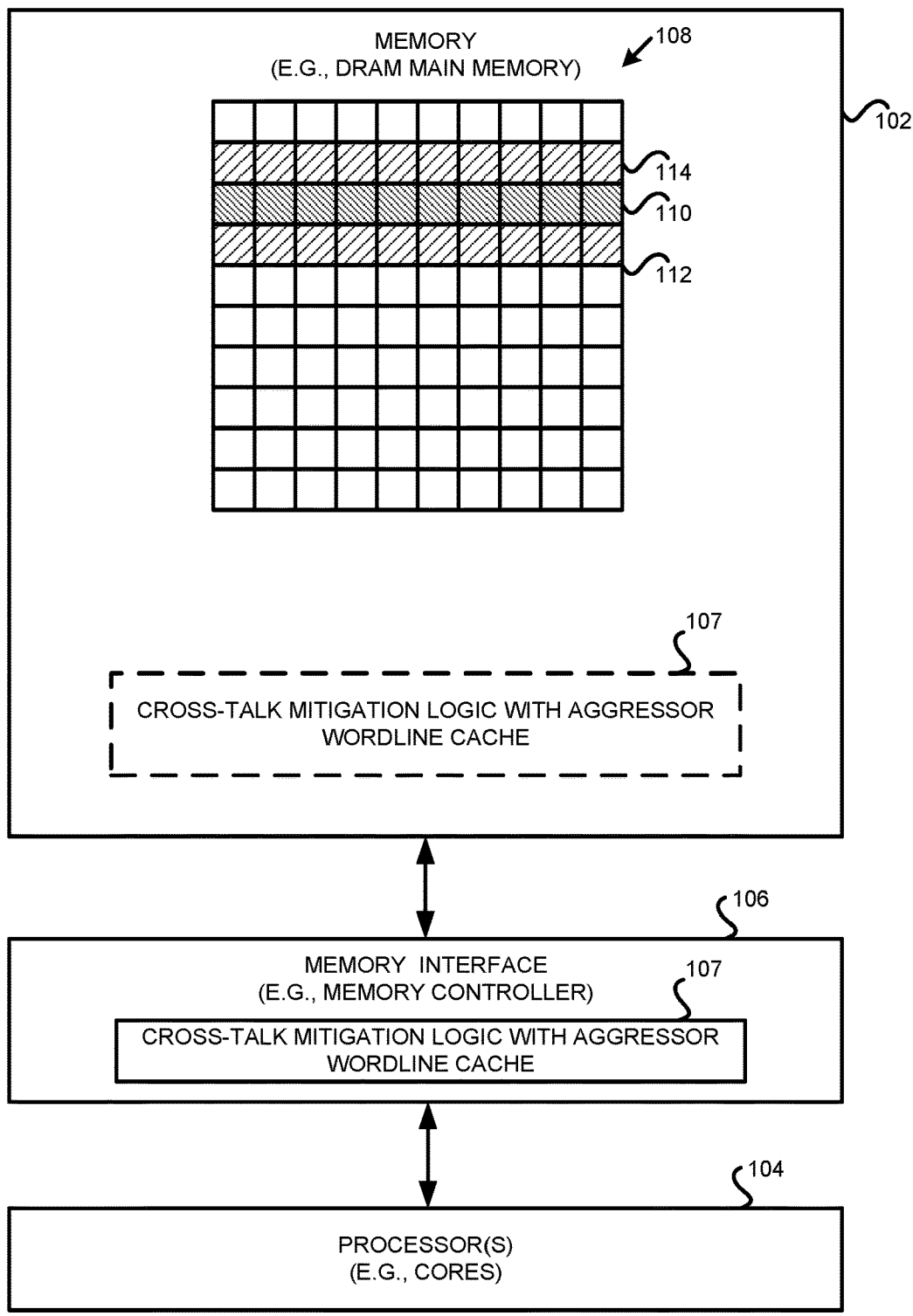
FIG. 1 is a block diagram illustrating a device in accordance with one example set forth in the disclosure.

Where a memory technology's scaling increases coupling between adjacent wordline cells, commonly referred to as crosstalk, the malicious exploit of this crosstalk by repeatedly accessing a wordline is known as row hammering. Disclosed herein is a solution for mitigating wordline crosstalk in a deep-scaled memory, such as DRAM. In certain implementations, a memory controller utilizes a low-cost hash function-based filter, such as a Bloom filter, to record the vulnerable wordline addresses. When a target wordline is the neighbor of a vulnerable line, the memory controller fetches the content of the target wordline into an on-chip aggressor wordline cache in order to do subsequent accesses of the corresponding wordline from the on-chip cache instead of the DRAM, thereby alleviating wordline crosstalk and defending the memory against row hammering attacks. The disclosed structure and operation reduces the number of accesses to frequently targeted wordlines (aggressors) that induce errors in the wordlines (victims) that are vulnerable to crosstalk.

In certain implementations, a method carried out by a device determines a candidate upper adjacent address and a candidate lower adjacent address of a target memory row corresponding to a read request to memory. When at least one of the candidate upper adjacent address or the candidate lower adjacent address are determined to be a victim row, the device checks an aggressor wordline cache that includes cached data from aggressor wordlines cached from the memory, for the target memory row and when there is a cache hit in the aggressor wordline cache, the device sends a corresponding cache line as a response to the read request, otherwise the device reads content from the memory.

In some examples, the method includes determining whether any of the candidate upper adjacent address and candidate lower adjacent address are victim rows based on data representing victim addresses in the memory, such as a bit array populated based on testing by a manufacturer of the memory.

In certain examples, the data representing victim addresses includes a stored bit array and the method includes using a hash function-based filter to determine whether any of the candidate upper adjacent address and candidate lower adjacent address are victim rows represented in the stored bit array. In some examples, the hash function-based filter includes using at least three different hash functions to generate matches to entries in the stored bit array and using a majority voting process on the generated matches to determine whether any of the candidate upper adjacent address and candidate lower adjacent address are victim rows. In some examples at least three matches to entries in the stored bit array are used to indicate a victim row. In some examples, the candidate upper adjacent address and the candidate lower adjacent address of the target memory row are generated based on the read request. In certain examples, the method includes updating the aggressor wordline cache with content from the memory, at least in part, in response to determining that at least one of: the candidate upper adjacent address and the candidate lower adjacent address a victim row.

In certain implementations, an integrated circuit includes an aggressor wordline cache and logic that determines a candidate upper adjacent address and a candidate lower adjacent address of a target memory row corresponding to a read request to memory. When at least one of the candidate upper adjacent address or the candidate lower adjacent address are determined to be a victim row, the logic checks the aggressor wordline cache for a cache hit for the target memory row and when there is a cache hit in the aggressor wordline cache, the logic sends a corresponding cache line as a response to the read request, otherwise the logic causes a read of content from the memory.

In some examples, the logic determines whether any of the candidate upper adjacent address and candidate lower adjacent address are victim rows based on data representing victim addresses in the memory. In certain examples, the logic includes a hash function-based filter such as a Bloom filter that includes a stored bit array and uses an odd number of hash functions. The filter works based on a majority voting process. The hash function-based filter determines whether any of the candidate upper adjacent address and candidate lower adjacent address are victim rows represented in the stored bit array. In some examples, the hash function-based filter includes at least three different hash functions that generate matches to entries in the stored bit array and uses a majority voting process on the generated matches to determine whether any of the candidate upper adjacent address and candidate lower adjacent address are victim rows.

In some examples, the logic includes adjacent row finder logic that generates the candidate upper adjacent address and the candidate lower adjacent address based on the read request. In certain examples, the logic updates the aggressor wordline cache with content from the memory in response, at least in part, to determining that at least one of: the candidate upper adjacent address and the candidate lower adjacent address is a victim row. In some examples, the aggressor wordline cache includes data corresponding to addresses of wordlines in the memory that have been predetermined to be aggressor addresses in the memory.

In certain implementations, a device includes memory, at least one processor, an aggressor wordline cache and logic that determines a candidate upper adjacent address and a candidate lower adjacent address of a target memory row corresponding to a read request to the memory, such as a read request, by the at least one processor. When at least one of the candidate upper adjacent address or the candidate lower adjacent address are determined to be a victim row, the logic checks the aggressor wordline cache for a cache hit for the target memory row and when there is a cache hit in the aggressor wordline cache, the logic sends a corresponding cache line as a response to the read request, otherwise the logic causes content to be read from the memory.

In some examples, the logic determines whether any of the candidate upper adjacent address and the candidate lower adjacent address are victim rows based on data representing predefined victim addresses in the memory. In certain examples, the logic includes a stored bit array and a hash function-based filter and the hash function-based filter determines whether any of the candidate upper adjacent address and the candidate lower adjacent address are victim rows represented in the stored bit array. In some examples, the hash function-based filter includes at least three different hash functions that generate matches to entries in the stored bit array and uses a majority voting process on the generated matches to determine whether any of the candidate upper adjacent address and the candidate lower adjacent address are victim rows.

In some examples, the logic includes adjacent row finder logic operative to generate the candidate upper adjacent address and the candidate lower adjacent address based on the read request. In certain examples, the logic updates the aggressor wordline cache with content from the memory in response, at least in part, to determining that at least one of: the candidate upper adjacent address and the candidate lower adjacent address are a victim row.

In some implementations, an integrated circuit includes an aggressor wordline cache and logic that determines that a target memory row corresponding to a read request to memory is an aggressor row. In certain implementations, when the target memory row is determined to be an aggressor row, the logic checks the aggressor wordline cache for a cache hit for the target memory row and when there is a cache hit in the aggressor wordline cache, the logic sends a corresponding cache line as a response to the read request, otherwise the logic reads content from the memory.

In certain examples, the logic includes a stored bit array that includes data representing predetermined aggressor rows in the memory and a hash function-based filter that determines whether the target memory row is an aggressor row represented in the stored bit array.

FIG. 1 illustrates one example of a device 100, such as an integrated circuit, system on-chip, laptop, portable device, server, printer, or any other suitable device that employs memory. In this example, the device includes memory 102, such as main memory in a computing device, one or more processors 104, such as one or more central processing unit (CPU) cores, graphic processing unit (GPU) cores, or any other computing unit that performs or issues read requests to the memory 102. A memory interface, such as a memory controller 106, includes cross-talk mitigation logic 107 with aggressor wordline cache. The memory controller 106 receives memory access requests such as read requests from the one or more processors 104 and retrieves the content from appropriate addresses corresponding to the memory requests from memory 102.

The memory 102 in this example is dynamic random access memory (DRAM) and includes a plurality of cells generally designated as 108 that are configured in rows and columns. In this example, 10 rows and 10 columns are shown. However, it will be recognized that any suitable type of memory and any suitable configuration may be employed. Each row is considered to be a wordline and corresponds to a physical address of the memory 102. In this example, each wordline includes 10 bits or cells. An aggressor row 110 if caused to undergo rapid row activations may cause changes in the value of bits stored in adjacent victim rows 112 and 114. The adjacent victim rows 112 and 114 are also referred to as vulnerable lines. These wordlines are vulnerable to cross-talk. In some implementations, the memory interface, such as memory controller 106 includes cross-talk mitigation logic 107 with an aggressor wordline cache. The cross-talk mitigation logic 107 is employed such that the memory controller fetches content of an accessed wordline into an on-chip cache, such as an aggressor wordline cache, when an aggressor wordline from a read request is the neighbor of a vulnerable line. The memory controller 106 performs subsequent accesses of the corresponding wordline from the on-chip cache instead of from the memory 102, thereby alleviating wordline cross-talk and defending the memory 102 against row hammering attacks.

Figure 2:
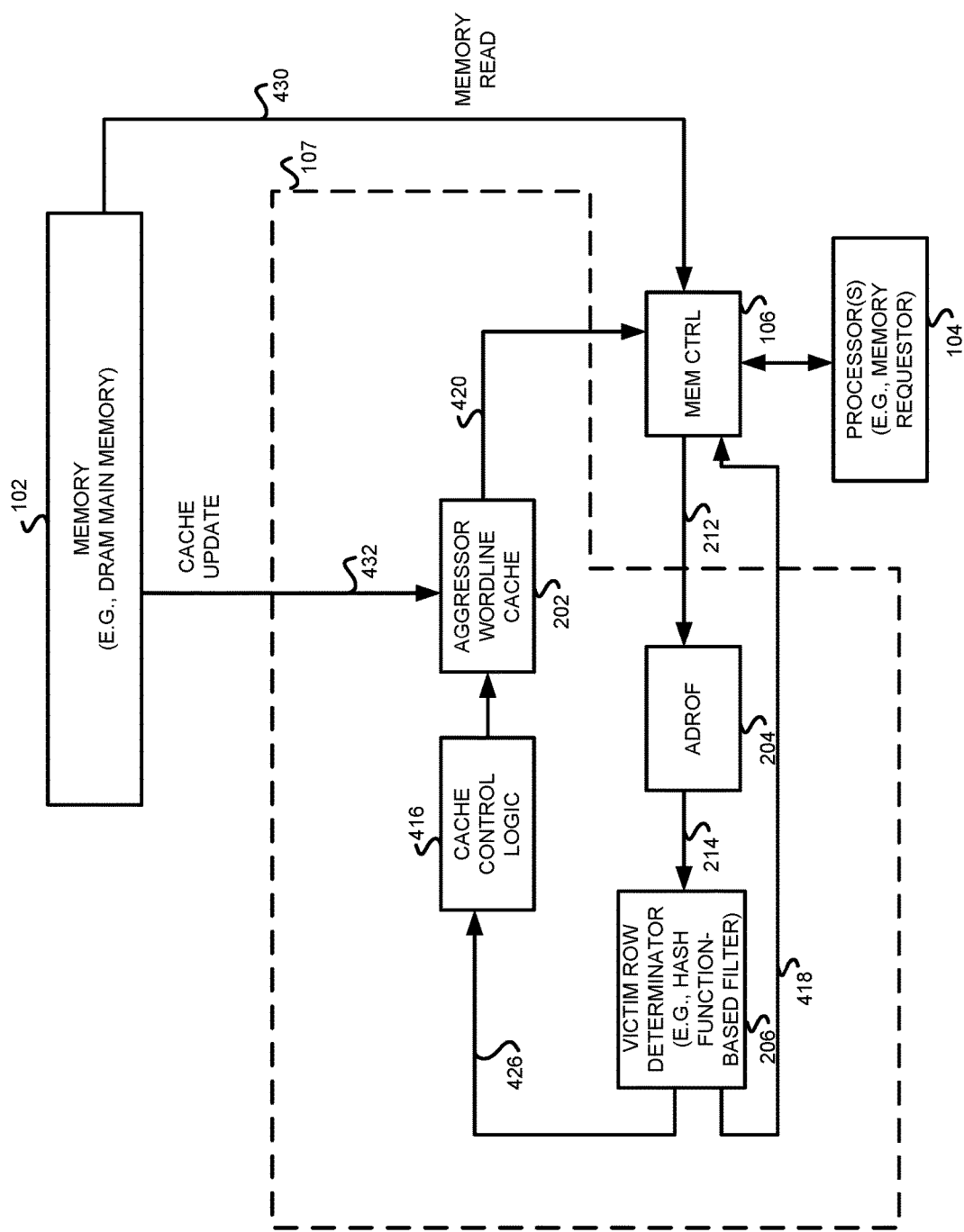
FIG. 2 is a block diagram illustrating a combination of functional blocks and operational blocks in accordance with one example set forth in the disclosure.

Referring also to FIG. 2, an example of the cross-talk mitigation logic 107 with aggressor wordline cache 202 is illustrated. The cross-talk mitigation logic 107 in one example is integrated as part of the memory controller 106, however in other implementations it is integrated as part of the main memory 102 or may be a stand-alone operational block. In this example, the cross-talk mitigation logic 107 is described as being integrated with the memory controller 106 as part of an integrated circuit that includes the one or more processors 104. However, any suitable configuration may be employed. The cross-talk mitigation logic 107 includes the aggressor wordline cache 202, adjacent row finder logic (ADROF) 204 and a victim row determinator 206 that includes, for example, a hash function-based filter, such as a Bloom filter. However, any suitable hash function-based filter may be employed.

Figure 3:
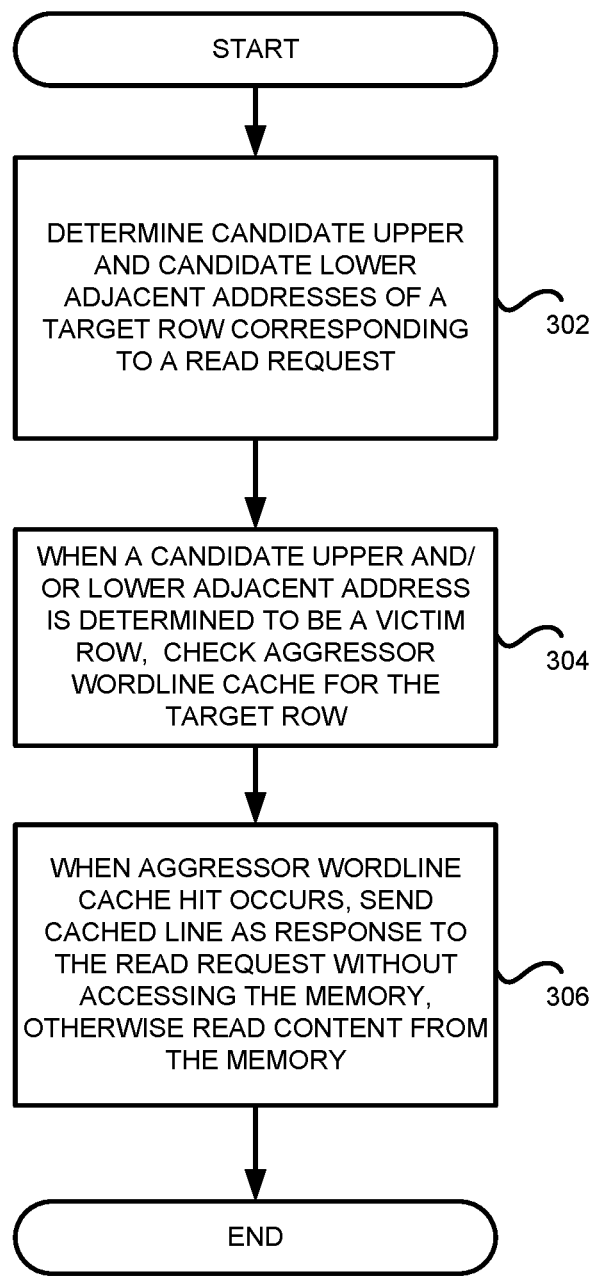
FIG. 3 is a flowchart illustrating a method for defending against row hammering attacks in accordance with one example set forth in the disclosure.

Referring also to FIG. 3, a method 300 for defending against row hammering attacks is illustrated. The method 300 in one example is carried out, for example, by the cross-talk mitigation logic 107. As shown in block 302, the method includes determining a candidate upper adjacent address and a candidate lower adjacent address of an accessed memory row corresponding to a read request to memory. For example, the memory controller 106 receives a memory request from a memory requestor such as one or more processors executing one or more applications or other code seeking data stored in the memory 102. The memory controller 106 processes the read request 212 which contains a target memory row and provides the target memory row to the adjacent row finder logic 204. The read request 212 has an associated target memory row that is evaluated.

The adjacent row finder logic 204 determines the candidate upper adjacent address and candidate lower adjacent address corresponding to the target memory row. For example, given that the memory controller 106 knows which rows are physically adjacent to each other, the adjacent row finder logic 204 determines the candidate upper adjacent address and candidate lower adjacent address of the target memory row, in this example, adjacent victim rows 112 and 114, where the target memory row corresponds to aggressor row 110. As such, a read request sent to the memory controller having a corresponding address referred to as a target memory row is sent to the adjacent row finder logic 204 and the adjacent row finder logic 204 provides the candidate upper adjacent address and candidate lower adjacent address 214 to the victim row determinator 206. The adjacent row finder logic 204 determines the candidate upper adjacent address and the candidate lower adjacent address of the target memory row by generating the candidate upper adjacent address and candidate lower adjacent address based on the read request and in the particular the target memory row in the read request 212.

In one example, the candidate upper adjacent address and candidate lower adjacent address 214 are sent sequentially to the victim row determinator 206 which checks whether either of the candidate upper adjacent address or candidate lower adjacent address are victim rows. In one example, the victim row determinator 206 includes a hash function-based filter that employs an odd number (n) of different hash functions and in this example uses three hash functions. In one example, in order for a candidate adjacent row to be verified as a victim row, a majority voting process is used, and in this example, all three hash functions must point to bits that have been "set" in a bit array, also referred to as a victim bit array (see e.g., FIG. 4). However, in other implementations of majority voting, such a two out of three bits matching, or where seven hash functions are used, five out of seven matching can be considered a hit, or any other suitable majority voting process may be used. As shown in block 304, the method includes, when a candidate upper adjacent address and/or candidate lower adjacent address is determined to be a victim row, checking the aggressor wordline cache 202 for the target memory row corresponding to the target memory row. Stated another way, in the case where one of the two candidate rows hits in the hash function-based filter, this indicates that the original target memory row of the read request may be an aggressor address. The aggressor wordline cache is a small buffer cache that is checked for the row. If the target memory row hits in the aggressor wordline buffer cache, the cache line is sent to the memory controller without accessing the main memory, thereby reducing the memory access time. The aggressor wordline cache includes data corresponding to addresses of wordlines in the memory that have been predetermined to be aggressor addresses in the memory. For example, as shown in block 306, when an aggressor wordline cache hit occurs, the method includes sending a corresponding cache line as a response to the read request, otherwise the method includes reading content from the memory as a response to the read request.

Figure 4:
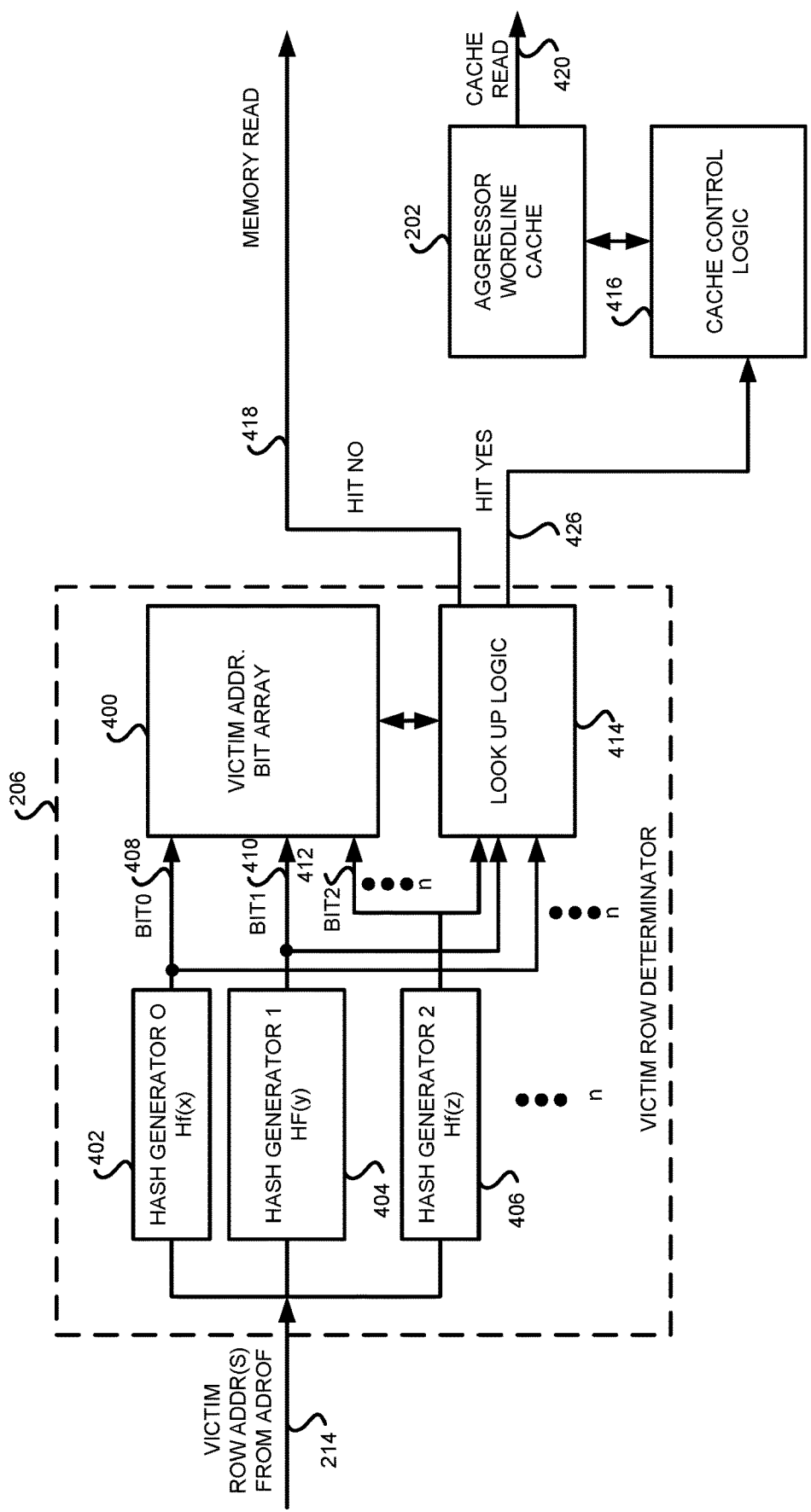
FIG. 4 is a block diagram illustrating one example of cross-talk mitigation logic with an aggressor wordline cache in accordance with the disclosure.

FIG. 4 illustrates an example of the victim row determinator 206 that includes a victim address bit array 400 that contains data representing victim addresses in the memory 102. For example, during manufacture, testing is performed to determine which rows in the memory are considered to be victim rows. The victim addresses are recorded using a hash function-based filter. Some implementations use a hash function-based filter to efficiently store victim row addresses found during testing. In certain implementations, the hash function-based filter includes three hash functions and a bit storage array. For each victim row address, the hash function-based filter sets three different bits in the bit array. The hash function-based filter is a probabilistic data structure for storing victim row addresses, thereby requiring an odd number of hash functions to decide whether the corresponding row is a victim row or not. For example, to populate the victim address bit array 400, a manufacturer may employ a hash function-based filter which is replicated in the victim row determinator 206. Since there are only a small number of victim rows in deeply scaled memory devices such as DRAMs, victim row addresses can be discovered as part of DRAM tests during the memory testing phase by the manufacturer or original equipment manufacturer. For example, this testing can read rows many times to find victim rows. After the victim row information is collected, the results are saved so that it can be stored in the bit array without requiring further testing. In this example, the hash function-based filter employs an odd number of hash generators, each performing a different hash function on a victim address, namely the candidate upper adjacent address and candidate lower adjacent address from the adjacent row finder logic 204. Any suitable number of odd hash functions may be employed. In this example, each hash generator 402, 404 and 406 outputs a corresponding bit 408, 410, and 412 which are used as pointers to bits in the victim address bit array 400. The lookup logic 414 uses the bits 408, 410, and 412 to lookup to see if the corresponding bits appears in the victim address bit array. If all three bits are found, a hit is designated by lookup logic. For example, given 9 hash functions, if 5 bits out of 9 bits are found, because of majority of 5 bits versus 4 bits, the filter determines the corresponding row is victim. The selection of the victim row depends on the design of the filter.

To reduce false positives of the filter, the designer may decide a row is victim as long as all 9 bits are found. During creation of the victim address bit array, victim row addresses may be fed into the hash generators to populate the victim address bit array or the manufacturer may supply the victim address bit array for storage in the cross-talk mitigation logic 107. Cache control logic 416 causes aggressor wordlines to be stored in the aggressor wordline cache 202 or for the already stored aggressor wordlines to be read out as a cache read when the victim row determinator 206 determines that a hit has occurred. If no hit occurs in the victim address bit array, then the read request is handled as a normal memory read 430 from memory 102 as opposed to a cache read 420 from the aggressor wordline cache 202.

The cross-talk mitigation logic 107 determines whether any of the candidate upper adjacent address and candidate lower adjacent address are victim rows based on data representing victim addresses in the memory. For example, the victim row determinator 206 stores the victim address bit array 400 which is data representing victim addresses in the memory and the lookup logic 414 determines whether there is a hit based on the incoming candidate upper adjacent address and candidate lower adjacent address 214 and those that are prestored as the victim addresses in the victim address bit array 400. The victim row determinator 206 as such includes the stored victim address bit array 400. The cross-talk mitigation logic 107 uses a hash function-based filter, in this example a Bloom filter that employs at least three different hash functions to generate matches to entries in the stored bit array and uses a majority voting process on the generated matches to determine whether any of the candidate upper adjacent address and candidate lower adjacent address are victim rows. In one example, at least three matches to entries in the stored bit array indicate that the candidate upper adjacent address and candidate lower adjacent address are victim rows represented in the stored bit array. The hash function-based filter is a probabilistic data structure that stores victim row addresses and uses an odd number of hash functions to decide whether the corresponding row, namely the target memory row, is a victim row or not. As such, all three bits must be found in the stored victim address bit array 400 for a hit to be designated. If two of the three are found in the stored victim address bit array 400, then a hit has not occurred. As such, in order for a candidate adjacent row to be verified as a victim row, all three hash functions, in this example must point to bits that have been set in the stored victim address bit array 400.

If the aggressor wordline from memory 102 is not already stored in the aggressor wordline cache 202, the method includes updating the aggressor wordline cache 202 with content for the target memory row from the memory in response, at least in part, to determining that at least one of: the candidate upper adjacent address and the candidate lower adjacent address is a victim row as determined by the victim row determinator 206.

Figure 5:
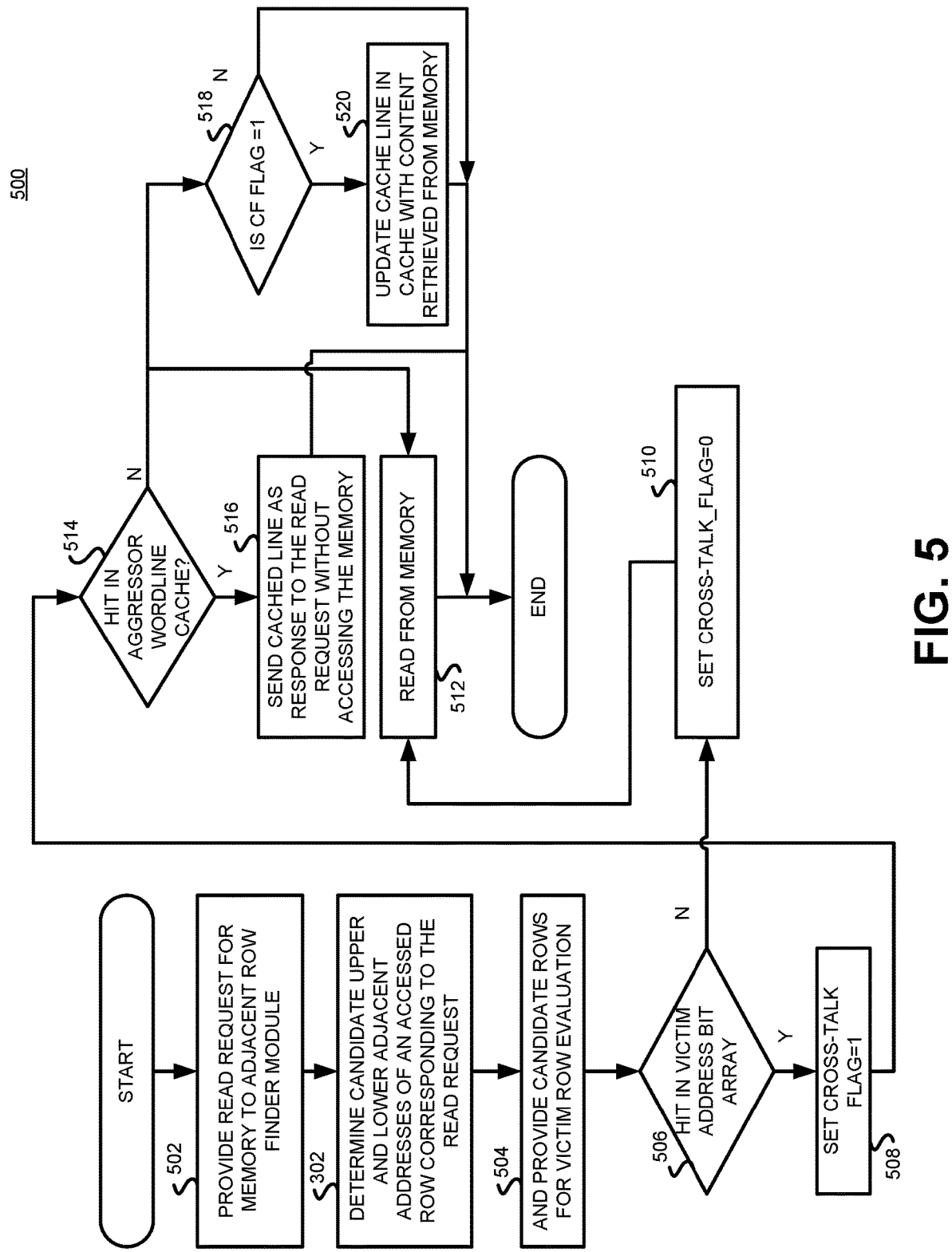
FIG. 5 is a flowchart illustrating a method for defending against row hammering attacks in accordance with one example set forth in the disclosure.

FIG. 5 illustrates one example of a method 500 for defending against row hammering attacks according to one example. As shown in block 502, the memory controller provides read requests for memory 102 to the adjacent row finder logic 204. In one example, this is done by the memory controller 106 in response to receiving a read request for a memory read operation for the memory 102 such as received from a memory requestor such as from processors 104. As shown in block 302, the adjacent row finder logic 204 determines a candidate upper adjacent address and a candidate lower adjacent address of the target memory row corresponding to the read request. In one example, the adjacent row finder logic 204 receives the target memory row associated with the read request from the memory controller 106 and determines candidate upper adjacent address and candidate lower adjacent address of the memory 102 with respect to the target memory row. As shown in block 504, the adjacent row finder logic 204 provides the candidate upper adjacent address and candidate lower adjacent address for victim evaluation to the victim row determinator 206. As shown in block 506, the victim row determinator determines if a hit occurs in the victim address bit array 400. In one example, this is done by the lookup logic 414. As shown in block 508, the lookup logic 414 sets a crosstalk flag=1 when a hit is detected, shown as data 426. As such, in one example, the lookup logic 414 sets the crosstalk flag indicating that the target memory row has been determined to be an aggressor address. In another example, the cache control logic 416 sets the crosstalk flag. As shown in block 510, the lookup logic 414 sets the crosstalk flag=0 if no hit is detected. The lookup logic 414 or the cache control logic 416 sets the crosstalk flag=0, and as such, the read request is handled by retrieving content from memory 102 as opposed to retrieving content from the aggressor wordline cache 202. For example, as shown in block 512, the memory controller 106 performs a normal memory read 430 from memory 102 in response to control data 418.

However, if a hit is detected by the victim row determinator 206, as shown in block 514, the cache control logic 416 determines if there is also a hit in the aggressor wordline cache 202. If a hit is detected, as shown in block 516, the cached line corresponding to the target memory row is sent from the aggressor wordline cache 202 as a response to the read request without accessing the memory 102. This is shown as cache read 420. However, if there has been a hit in the victim row determinator 206 but not hit in the aggressor wordline cache 202, the crosstalk flag is set to equal to 1 as shown in block 518 which causes the memory controller 106 to update the cache line as shown by arrow 432 in the cache with content retrieved from memory 102 so that subsequent read requests to the target memory row can be later retrieved from the aggressor wordline cache 202 instead of the memory 102. This is shown in block 520. Referring back to block 518, if the crosstalk flag=0 then the process ends and a next read request is evaluated.

Stated another way, for a read request from the memory controller 106 to the main memory 102, the corresponding address is sent to the adjacent row finder 204 that determines the candidate upper adjacent address and candidate lower adjacent address of the target memory row. Given that the memory controller 106 knows which rows are physically adjacent to each other, the ADROF 204 determines the candidate upper adjacent address and candidate lower adjacent address of the target memory row and sends these candidates sequentially to the hash function-based filter of the victim row determinator 206 in order to check whether they are victim rows. Since the memory controller understands the mapping between the logical and physical row addresses, the ADROF uses simple combinational logic to find the neighboring rows. In order to determine whether they are victim rows or not, the addresses of the potential victim rows can be looked up either sequentially or in parallel by the victim row determinator 206. In this example, in order for a candidate to be verified as a victim row, all three hash functions must point to bits that have been 'set' in the bit array. However, any suitable voting process may be used.

If the candidate row misses in the hash function-based filter, the content of the target memory row proceeds to access the main memory 102 and returns data to the memory control 106. In the case where one of the two candidate rows hit in the hash function-based filter, this indicates that the original access may be an aggressor. A crosstalk flag is set, and the aggressor wordline cache 202 is checked for the row. If the accessing row hits in the aggressor wordline cache 202, the cached line is sent to the memory controller 106 without accessing the main memory, thereby reducing the memory access time. If the access misses in the aggressor wordline cache 202, the row is read from the DRAM. Since the crosstalk flag is set, the memory controller 106 updates the aggressor wordline cache 202 with the content retrieved from memory.

The contents of the hash function-based filter can be stored in either volatile or non-volatile memory (volatile storage must be reloaded during reset). In certain implementations, the hash function-based filter is a 1.25 KB direct-mapped cache with 64-bit line size. In this case, the candidate upper adjacent address and candidate lower adjacent address of the target memory row are sequentially fed to the hash function-based filter. To reduce the latency of sequential accesses to the hash function-based filter, two hash function-based filters are used in parallel for checking whether the candidate upper adjacent address and candidate lower adjacent address of the target memory row are victims or not at the expense of extra area overhead. However, note that because of false positives in the hash function-based filter, sometimes the content of non-aggressor rows is fetched into the buffer-cache, thereby cutting high memory access latency and mitigating crosstalk at the expense of more buffer cache evictions.

In some implementations, the described structure is in the memory device in which case the memory controller remains unchanged. In this case, first the memory request is sent to the memory device and then the logic decides whether to reduce the number of accesses to the main memory or not.

In other implementations, the adjacent row finder is not used and the hash function-based filter does not store adjacent row data, namely victim rows, but instead stores data representing predetermined aggressor rows in the bit array. In this example, no victim address bit array is employed but instead the bit array stores aggressor addresses (which as used herein also includes indexes to addresses). As such, instead the look up logic identifies that an accessed line in memory (a target memory row corresponding to the read request) is the aggressor row. For example, the bit array is prepopulated with aggressor rows instead of victim rows and the hash function-based filter uses the hash functions on the target memory row and if matches are found in the bit array, the target memory row is determined to be an aggressor row and data is read from the aggressor wordline cache 202 instead of memory 102, or if a cache miss occurs, the aggressor wordline cache is populated with the data from the aggressor wordline from memory for the next time a read occurs to that address. As such, rather than checking a target memory row against a victim row list, the cross-talk mitigation logic 107 with aggressor wordline cache checks the target memory row against a list of known aggressor addresses.

In certain implementations, an integrated circuit includes the aggressor wordline cache and cross-talk mitigation logic 107 that determines that a target memory row corresponding to a read request to memory is an aggressor row. When the target memory row is determined to be an aggressor row, the logic checks the aggressor wordline cache for a cache hit for the target memory row and when there is a cache hit in the aggressor wordline cache, the logic sends a corresponding cache line as a response to the read request, otherwise the logic reads content from the memory. In this example, the logic stored bit array includes data representing predetermined aggressor rows in the memory and the hash function-based filter determines whether the target memory row is an aggressor row represented in the stored bit array.

Figure 6:
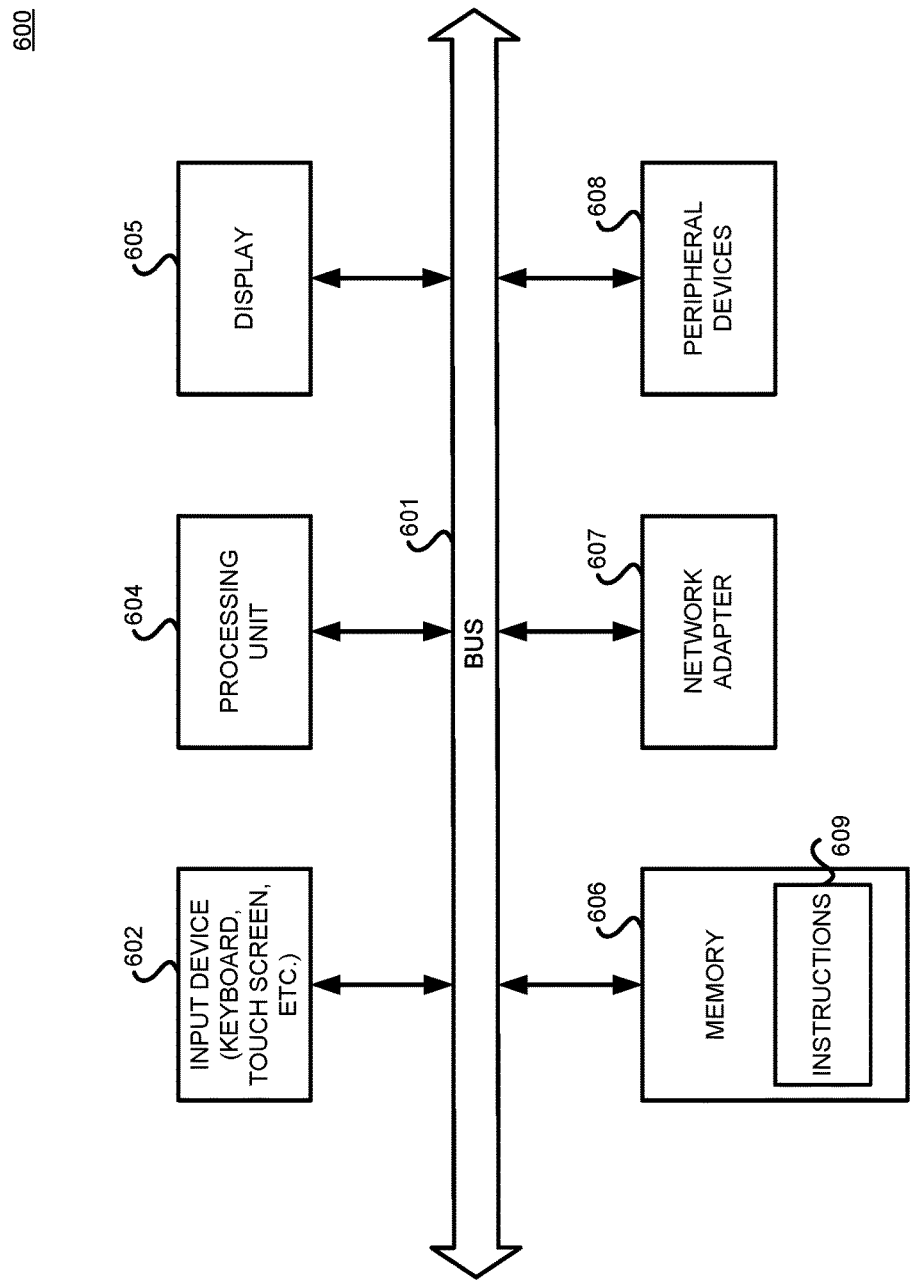
FIG. 6 is a block diagram illustrating a device in accordance with one example set forth in the disclosure.

FIG. 6 illustrates an embodiment of a computing system 600 that uses cross-talk mitigation logic with an aggressor wordline cache. In general, the computing system 600 is embodied as any of a number of different types of devices, including but not limited to a laptop or desktop computer, mobile device, server, network switch or router, system on chip, integrated circuit, multipackage device etc. In this example, the computing system 600 includes a number of components 602-608 that communicate with each other through a bus 601. In computing system 600, each of the components 602-608 is capable of communicating with any of the other components 602-608 either directly through the bus 601, or via one or more of the other components 602-608. The components 601-608 in computing system 600 are contained within a single physical enclosure, such as a laptop or desktop chassis, or a mobile phone casing or in some implementations are a system on chip or other configuration. In alternative embodiments, some of the components of computing system 600 are embodied as peripheral devices such that the entire computing system 600 does not reside within a single physical enclosure.

In some implementations, the computing system 600 also includes user interface devices for receiving information from or providing information to a user. Specifically, the computing system 600 includes an input device 602, such as a keyboard, mouse, touch-screen, or other device for receiving information from the user. The computing system 600 displays information to the user via a display 605, such as a monitor, light-emitting diode (LED) display, liquid crystal display, or other output device. However, such devices need not be employed.

In certain implementations, computing system 600 additionally includes a network adapter 607 for transmitting and receiving data over a wired or wireless network. Computing system 600 also includes one or more peripheral devices 608. The peripheral devices 608 may include mass storage devices, location detection devices, sensors, input devices, or other types of devices used by the computing system 600.

Computing system 600 includes a processing unit 604. The processing unit 604 receives and executes instructions 609 that are stored in a memory system 606. In one embodiment, the processing unit 604 includes multiple processing cores that reside on a common integrated circuit substrate. Memory system 606 includes memory devices used by the computing system 600, such as random-access memory (RAM) modules, read-only memory (ROM) modules, hard disks, and other non-transitory computer-readable media. Some of the memory devices are used as memory 102 for the processing unit 604. In some implementations, the computing system 600 includes a memory controller that interfaces with one or more components of the memory system 606 such as DRAM memory and includes the cross-talk mitigation logic and aggressor wordline cache as described above. In other implementations, the memory system 606 includes memory devices that include the cross-talk mitigation logic with the aggressor wordline cache as described above. As such, the cross-talk mitigation logic with an aggressor wordline cache is represented by processing unit 604 and/or by memory system 606 in this example.

Some embodiments of computing system 600 may include fewer or more components than the embodiment as illustrated in FIG. 6. For example, certain embodiments are implemented without any display 605 or input devices 602. Other embodiments have more than one of a particular component; for example, an embodiment of computing system 600 could have multiple processing units 604, buses 601, network adapters 607, memory systems 606, etc.

Although features and elements are described above in particular combinations, each feature or element can be used alone without the other features and elements or in various combinations with or without other features and elements. The apparatus described herein in some implementations are manufactured by using a computer program, software, or firmware incorporated in a non-transitory computer-readable storage medium for execution by a general-purpose computer or a processor. Examples of computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

In the preceding detailed description of the various embodiments, reference has been made to the accompanying drawings which form a part thereof, and in which is shown by way of illustration specific preferred embodiments in which the invention may be practiced. These embodiments are described in sufficient detail to enable those skilled in the art to practice the invention, and it is to be understood that other embodiments may be utilized, and that logical, mechanical and electrical changes may be made without departing from the scope of the invention. To avoid detail not necessary to enable those skilled in the art to practice the invention, the description may omit certain information known to those skilled in the art. Furthermore, many other varied embodiments that incorporate the teachings of the disclosure may be easily constructed by those skilled in the art. Accordingly, the present invention is not intended to be limited to the specific form set forth herein, but on the contrary, it is intended to cover such alternatives, modifications, and equivalents, as can be reasonably included within the scope of the invention. The preceding detailed description is, therefore, not to be taken in a limiting sense, and the scope of the present invention is defined only by the appended claims. The above detailed description of the embodiments and the examples described therein have been presented for the purposes of illustration and description only and not by limitation. For example, the operations described are done in any suitable order or manner. It is therefore contemplated that the present invention covers any and all modifications, variations or equivalents that fall within the scope of the basic underlying principles disclosed above and claimed herein.

The above detailed description and the examples described therein have been presented for the purposes of illustration and description only and not for limitation.

What is claimed is:

1. A method carried out by a device, the method comprising:
    determining a candidate upper adjacent address and a candidate lower adjacent address of a target memory row corresponding to a read request to a memory;
    when at least one of: the candidate upper adjacent address and the candidate lower adjacent address is determined to be a victim row, checking an aggressor wordline cache that comprises cached data from aggressor wordlines cached from the memory, for the target memory row; and
    when there is a cache hit in the aggressor wordline cache, sending a corresponding cache line as a response to the read request, otherwise reading content from the memory.

2. The method of claim 1, further comprising determining whether any of the candidate upper adjacent address and the candidate lower adjacent address are victim rows based on data representing victim addresses in the memory.

3. The method of claim 2, wherein:
    the data representing victim addresses comprises a stored bit array; and
    the method further comprises using a hash function-based filter to determine whether any of the candidate upper adjacent address and the candidate lower adjacent address are victim rows represented in the stored bit array.

4. The method of claim 1, wherein determining the candidate upper adjacent address and the candidate lower adjacent address of the target memory row comprises generating the candidate upper adjacent address and the candidate lower adjacent address based on the read request.

5. The method of claim 1, further comprising updating the aggressor wordline cache with content from the memory in response, at least in part, to determining that at least one of: the candidate upper adjacent address and the candidate lower adjacent address is a victim row.

6. The method of claim 3, wherein using the hash function-based filter comprises using at least three different hash functions to generate matches to entries in the stored bit array and using a majority voting process on the generated matches to determine whether any of the candidate upper adjacent address and the candidate lower adjacent address are victim rows.

7. An integrated circuit, comprising:
    an aggressor wordline cache;
    logic, operatively coupled to the aggressor wordline cache, and operative to:
        determine a candidate upper adjacent address and a candidate lower adjacent address of a target memory row corresponding to a read request to a memory;
        when at least one of: the candidate upper adjacent address and the candidate lower adjacent address is determined to be a victim row, check the aggressor wordline cache for a cache hit for the target memory row; and
        when there is a cache hit in the aggressor wordline cache, send a corresponding cache line as a response to the read request, otherwise read content from the memory.

8. The integrated circuit of claim 7, wherein the logic is further operative to determine whether any of the candidate upper adjacent address and the candidate lower adjacent address are victim rows based on data representing victim addresses in the memory.

9. The integrated circuit of claim 8, wherein:
the logic further comprises a stored bit array and a hash function-based filter; and
the hash function-based filter is configured to determine whether any of the candidate upper adjacent address and the candidate lower adjacent address are victim rows represented in the stored bit array.

10. The integrated circuit of claim 9, wherein the hash function-based filter comprises at least three different hash functions operative to generate matches to entries in the stored bit array and using a majority voting process on the generated matches to determine whether any of the candidate upper adjacent address and the candidate lower adjacent address are victim rows.

11. The integrated circuit of claim 7, wherein the logic further comprises adjacent row finder logic operative to generate the candidate upper adjacent address and the candidate lower adjacent address based on the read request.

12. The integrated circuit of claim 7, wherein the logic is further operative to update the aggressor wordline cache with content from the memory in response, at least in part, to determining that at least one of: the candidate upper adjacent address and the candidate lower adjacent address is a victim row.

13. The integrated circuit of claim 7, wherein the aggressor wordline cache comprises data corresponding to addresses of wordlines in the memory that have been predetermined to be aggressor addresses in the memory.

14. A device, comprising:
a memory;
at least one processor, operatively coupled to the memory;
an aggressor wordline cache operatively coupled to the memory;
logic, operatively coupled to the aggressor wordline cache, and operative to:
determine a candidate upper adjacent address and a candidate lower adjacent address of a target memory row corresponding to a read request to the memory, by the at least one processor;
when at least one of: the candidate upper adjacent address and the candidate lower adjacent address is determined to be a victim row, check the aggressor wordline cache for a cache hit for the target memory row; and
when there is a cache hit in the aggressor wordline cache, send a corresponding cache line as a response to the read request, otherwise read content from the memory.

15. The device of claim 14, wherein the logic is further operative to determine whether any of the candidate upper adjacent address and the candidate lower adjacent address are victim rows based on data representing victim addresses in the memory.

16. The device of claim 15, wherein:
the logic further comprises a stored bit array and a hash function-based filter; and
the hash function-based filter is configured to determine whether any of the candidate upper adjacent address and the candidate lower adjacent address are victim rows represented in the stored bit array.

17. The device of claim 16, wherein the logic further comprises adjacent row finder logic operative to generate the candidate upper adjacent address and the candidate lower adjacent address based on the read request.

18. The device of claim 17, wherein the hash function-based filter comprises at least three different hash functions operative to generate matches to entries in the stored bit array and using a majority voting process on the generated matches to determine whether any of the candidate upper adjacent address and the candidate lower adjacent address are victim rows.

19. The device of claim 14, wherein the logic is further operative to update the aggressor wordline cache with content from the memory in response, at least in part, to determining that at least one of: the candidate upper adjacent address and the candidate lower adjacent address is a victim row.

20. The device of claim 14, wherein the aggressor wordline cache comprises data corresponding to addresses of wordlines in the memory that have been predetermined to be aggressor addresses in the memory.

21. An integrated circuit, comprising:
an aggressor wordline cache;
logic, operatively coupled to the aggressor wordline cache, and operative to:
determine that a target memory row corresponding to a read request to a memory is an aggressor row;
when the target memory row is determined to be an aggressor row, check the aggressor wordline cache for a cache hit for the target memory row; and
when there is a cache hit in the aggressor wordline cache, send a corresponding cache line as a response to the read request, otherwise read content from the memory.

22. The integrated circuit of claim 21, wherein the logic further comprises:
a stored bit array that includes data representing predetermined aggressor rows in the memory; and
a hash function-based filter that is configured to determine whether the target memory row is an aggressor row represented in the stored bit array.

* * * * *